US009159595B2

(12) United States Patent  
Hurley et al.

(10) Patent No.: US 9,159,595 B2  
(45) Date of Patent: Oct. 13, 2015

(54) THIN WAFER CARRIER

(75) Inventors: Daniel T. Hurley, Waterbury, VT (US); Gregory George, Colchester, VT (US)

(73) Assignee: SUSS MicroTec Lithography GmbH, Garching (DE)

(*) Notice: Subject to any disclaimer, the term of this patent is extended or adjusted under 35 U.S.C. 154(b) by 928 days.

(21) Appl. No.: 13/022,215

(22) Filed: Feb. 7, 2011

(65) Prior Publication Data

US 2011/0198817 A1 Aug. 18, 2011

Related U.S. Application Data

(60) Provisional application No. 61/302,676, filed on Feb. 9, 2010.

(51) Int. Cl.
| | |
|---|---|
| H01L 21/683 | (2006.01) |
| B23B 31/30 | (2006.01) |
| H01L 21/67 | (2006.01) |
| B23Q 3/08 | (2006.01) |

(52) U.S. Cl.
CPC .......... *H01L 21/67092* (2013.01); *B23Q 3/088* (2013.01); *H01L 21/67144* (2013.01); *H01L 21/6835* (2013.01); *H01L 21/6838* (2013.01); *B23B 31/307* (2013.01); *H01L 21/6836* (2013.01); *H01L 2221/6834* (2013.01); *H01L 2221/68381* (2013.01); *Y10T 279/11* (2015.01)

(58) Field of Classification Search
CPC .................................................. H01L 21/6838
USPC .............. 279/3; 269/21; 324/750.2; 414/941
See application file for complete search history.

(56) References Cited

U.S. PATENT DOCUMENTS

| | | | |
|---|---|---|---|
| 4,561,688 A | 12/1985 | Tsutsui | |
| 5,260,514 A | 11/1993 | Fruen, Jr. | |
| 6,024,631 A * | 2/2000 | Piper | 451/41 |
| 6,271,676 B1 | 8/2001 | Montoya | |
| 6,273,048 B1 | 8/2001 | Kargilis | |
| 6,369,596 B1 * | 4/2002 | Anderson | 324/750.25 |
| 6,446,948 B1 * | 9/2002 | Allen | 269/21 |
| 6,590,381 B1 * | 7/2003 | Iino et al. | 324/750.2 |
| 6,644,703 B1 | 11/2003 | Levin et al. | |
| 6,844,921 B2 * | 1/2005 | Komatsu | 355/72 |
| 6,966,560 B2 * | 11/2005 | Demel et al. | 279/3 |
| 7,021,635 B2 * | 4/2006 | Sheydayi | 279/3 |
| 7,292,426 B2 * | 11/2007 | Ito et al. | 361/234 |
| 7,601,224 B2 * | 10/2009 | Foree | 118/725 |
| 7,602,476 B2 * | 10/2009 | Miyajima | 355/72 |
| 7,607,647 B2 * | 10/2009 | Zhao et al. | 269/21 |

(Continued)

FOREIGN PATENT DOCUMENTS

| | | |
|---|---|---|
| EP | 1521120 A2 | 4/2005 |
| JP | 2003-145473 A | 5/2003 |

(Continued)

*Primary Examiner* — Eric A Gates  
*Assistant Examiner* — Paul M Janeski  
(74) *Attorney, Agent, or Firm* — Fenwick & West LLP

(57) ABSTRACT

An improved wafer carrier device for carrying and holding semiconductor wafers that have a thickness of below 100 micrometers includes a transportable wafer chuck having an enclosed vacuum reservoir and a top surface configured to support a wafer. The top surface has one or more through-openings extending from the top surface to the vacuum reservoir and the wafer is held onto the top surface via vacuum from the vacuum reservoir drawn through the through-openings.

21 Claims, 6 Drawing Sheets

(56) References Cited

U.S. PATENT DOCUMENTS

| | | |
|---|---|---|
| 8,446,566 B2 * | 5/2013 | Kuit et al. .................. 355/72 |
| 2003/0141673 A1 | 7/2003 | Olgado et al. |
| 2008/0064184 A1 | 3/2008 | Lackner et al. |
| 2008/0146124 A1 * | 6/2008 | Morita ...................... 451/289 |
| 2008/0277885 A1 | 11/2008 | Duff et al. |
| 2008/0316461 A1 * | 12/2008 | Compen .................... 355/73 |
| 2009/0004824 A2 | 1/2009 | Lackner et al. |
| 2009/0085168 A1 * | 4/2009 | Kobayashi et al. ........ 257/620 |
| 2009/0218560 A1 | 9/2009 | Flaim et al. |
| 2010/0301534 A1 | 12/2010 | Im |
| 2013/0021717 A1 * | 1/2013 | Singh ........................ 361/234 |

FOREIGN PATENT DOCUMENTS

| | | |
|---|---|---|
| JP | 2005-050855 A | 2/2005 |
| JP | 2007-157953 A | 6/2007 |
| JP | 2007-157998 A | 6/2007 |
| JP | 2009-194217 A | 8/2009 |
| WO | WO02056350 A2 | 7/2002 |
| WO | 2007114331 A1 | 10/2007 |

* cited by examiner

THIN WAFER CARRIER

CROSS REFERENCE TO RELATED APPLICATIONS

This application claims the benefit of U.S. provisional application Ser. No. 61/302,676 filed Feb. 9, 2010 and entitled "THIN WAFER CARRIER", the contents of which are expressly incorporated herein by reference.

FIELD OF THE INVENTION

The present invention relates to carriers for thin wafers and more particularly to a transportable temporary thin wafer carrier used for supporting wafers having a thickness of less than 100 micrometers.

BACKGROUND OF THE INVENTION

Several semiconductor wafer processes include wafer thinning steps. In some applications, the wafers are thinned down to a thickness of less than 100 micrometers for the fabrication of integrated circuit (IC) devices. Thin wafers have the advantages of improved heat removal and better electrical operation of the fabricated IC devices. In one example, GaAs wafers are thinned down to 25 micrometers to fabricate power CMOS devices with improved heat removal. Wafer thinning also contributes to a reduction of the device capacitance and to an increase of its impedance, both of which result in an overall size reduction of the fabricated device. In other applications, wafer thinning is used for 3D-Integration bonding and for fabricating through-wafer-vias.

In the manufacturing of 3D-integrated semiconductors, two primary methods of assembly are utilized, WLP (wafer level packaging) and C2W (Chip to wafer stacking). In both cases, thinned semiconductors are mass-produced by using a temporary adhesive to bond the device wafer to a carrier wafer (typically glass or silicon) for the purpose of support during thinning and post processing after thinning. The device wafer is thus supported during thinning by the carrier. We refer to this as the primary temporary wafer carrier.

The thinned device wafer on the temporary wafer carrier is further processed to create through-silicon-vias (TSV) which terminate in plated or deposited interconnects on one or both side surfaces of the wafer. The surface structures may include landing bond pads, interconnect metal posts or plated micro bumps to form the primary interconnect for 3D stacking. Device wafers needing structures on both sides may require "flipping" to expose the secondary device wafer surface after release from the primary temporary wafer carrier.

Device wafers thinned below 70-80 micrometers cannot be handled without support. The primary methods of support involve bonding the device wafers to primary carrier wafers using temporary removable adhesives. Following thinning of the device wafer, the primary carrier wafer is removed. A secondary temporary carrier is usually used to support the thinned wafer for further processing. The secondary temporary wafer carrier needs to be portable, needs to be able to provide the required means for support to allow transport of the thinned device wafer to other process stations, and must prevent flexure stress and/or cracking after the device wafer is released from the primary temporary carrier.

Wafer thinning is usually performed via back-grinding and/or chemical mechanical polishing (CMP). CMP involves bringing the wafer surface into contact with a hard and flat rotating horizontal platter in the presence of a liquid slurry. The slurry usually contains abrasive powders, such as diamond or silicon carbide, along with chemical etchants such as ammonia, fluoride, or combinations thereof. The abrasives cause substrate thinning, while the etchants polish the substrate surface at the submicron level. The wafer is maintained in contact with the abrasives until a certain amount of substrate has been removed in order to achieve a targeted thickness.

For wafer thicknesses over 200 micrometers, the wafer is usually held in place with a fixture that utilizes a vacuum chuck or some other means of mechanical attachment. However, for wafer thicknesses of less than 200 micrometer and especially for wafers of less than 100 micrometers, it becomes increasingly difficult to mechanically hold the wafers and to maintain control of the planarity and integrity of the wafers during thinning. In these cases, it is actually common for wafers to develop microfractures and to break during CMP.

An alternative to mechanical holding of the wafers during thinning involves attaching a first surface of the device wafer onto a primary carrier wafer and thinning down the exposed opposite device wafer surface. The bond between the primary carrier wafer and the device wafer is temporary and is removed (i.e., debonded) upon completion of the thinning processing steps. Several temporary bonding techniques have been suggested including the use of adhesive compounds that are chemically dissolved after processing or the use of adhesive tapes or layers that are thermally or via radiation decomposed after processing. Most of these adhesive-based temporary bonding techniques are followed by a thermal slide debonding process where the device wafer and the carrier wafer are held by vacuum chucks while heat is applied to the bonded wafer pair and the wafers slide apart from each other. In the current thermal slide debonding process and the further processing the separated thinned device wafer is held via a secondary support mechanism for further processing. This secondary support mechanism usually adds cost and complications to the processing equipment. It is desirable to reduce the added cost and complications.

Prior art secondary carriers included electrostatic chucking (ESC) and Gel Pak™. Electrostatic chucks use electrostatic attraction to hold the device wafer to a tool chuck face and once charged they are portable. ESC carriers suffer from three primary drawbacks. First the capacitance of the device and its electrostatic effect are diminished with heat. For thermoplastic temporary adhesives, for example, the release mechanism is reheating to soften the adhesive for debonding. During this process the secondary carrier is exposed to higher temperatures which results in limiting adhesion to the secondary carrier. Second, device wafers having topography above 20 micrometers or micro bumps adhere poorly to the secondary ESC chuck. Finally, the development for the electrostatic attractive force is related to the surface area of the ESC chuck and the applied voltage. Although low current is applied, higher voltages are required for smaller wafers below 300 mm resulting in charging up of the device wafer. To date, ESC chucks have been able to be scaled down to 100 mm but not smaller.

Gel Pak™ is a trademarked commercial product designed for temporary secure storage and transfer of diced die and thinned wafers. This method relies on a modified tackified adhesive sheet. A thermoplastic material in nature, this material can be applied to the wafer in sheet form suspended over a support structure which is portable in nature. It uses a vacuum release technology to draw the adhesive sheet tightly against a fabric screen membrane resulting in a reduced contact area with the adhesive and the subsequent release of the wafer. The primary material adhesive sheet however has two primary drawbacks. First, it is affected by increased processing temperature softening and thus releases prematurely before the primary temporary adhesive is released. Second, the material is attacked vigorously by standard solvents used to remove primary thin wafer handling adhesive residue from the device wafer resulting in premature release.

It is desirable to have a portable secondary carrier for thinned wafers that overcomes the above mentioned problems.

SUMMARY OF THE INVENTION

The present invention relates to a transportable wafer carrier device for handling of highly thinned semiconductor wafers having a diameter in the range of 50 mm to 300 mm and a thickness of less than 100 micrometers.

In general, in one aspect, the invention features a transportable wafer carrier device that includes a wafer chuck having an enclosed vacuum reservoir and a top surface configured to support a wafer. The top surface has one or more through-openings extending from the top surface to the vacuum reservoir and the wafer is held onto the top surface via vacuum from the vacuum reservoir drawn through the through-openings.

Implementations of this aspect of the invention may include one or more of the following features. The wafer chuck includes a top component and a bottom component. The top component has the top surface and a bottom surface. The bottom component includes the enclosed vacuum reservoir and is in contact with and attached to the bottom surface of the top component. The top component includes the one or more through-openings extending from the top surface to the bottom surface and communicating with the vacuum reservoir. The device further includes a sealing component formed on the perimeter of the top surface and configured to form a seal between the top surface and a wafer surface being in contact with the top surface. The sealing component may be placed in a radial groove formed on the perimeter of the top surface or spin-coated on the perimeter of the top surface. The top surface of the top component is dimensioned to match the dimensions of the supported wafer. The top component is detachably attached to the bottom component, thereby allowing the wafer carrier to have interchangeable top components. The top and bottom components are made of silicon, alumina, or ceramic materials with a coefficient of thermal expansion (CTE) that matches the CTE of the wafer. The top surface includes three-dimensional support structures dimensioned to support the wafer. The three-dimensional support structures may be posts or radially extending arms. The three-dimensional support structures include structures complementing three dimensional structures formed on the wafer surface being in contact with the top surface. The three-dimensional support structures include structures complementing bumps or bond pads formed on a wafer surface being in contact with the top surface. The three-dimensional support structures are produced via chemical deposition techniques including chemical vapor deposition (CVD), physical vapor deposition (PVD) or metal-organic chemical vapor deposition (MOCVD). The three-dimensional support structures are produced by depositing a photochemically sensitive layer and applying photolithography and photomasking techniques. The three-dimensional support structures are machined via chemical or abrasive etching. The three-dimensional support structures are coated with a protective layer, and the protective layer may be polyimide, PEEK or a thermoplastic layer. The device may further include a compliant heat tolerant membrane member attached to the top surface. The compliant membrane may be Kalrez, Teflon, or a fluoropolymer. The device may further include a sealing component on the perimeter of the top surface. The sealing component is an O-ring having a height matching the height of the three-dimensional support structures. The O-ring is placed in a radial groove formed on the perimeter of the top surface. The sealing component is spin-coated on the perimeter of the top surface. The top surface further includes alignment structures for orienting and aligning the wafer. The alignment structures may be pins, grooves, notches or elastomeric inserts embedded in the top surface. The bottom component may further include a vacuum port connecting the vacuum reservoir to a vacuum pump. The device may further include a micro-valve assembly and the micro-valve assembly isolates the vacuum reservoir from the vacuum port. The wafer is held on the top surface via an adjustable vacuum.

Among the advantages of this invention may be one or more of the following. The transportable wafer carrier of this invention is used for exposing the debonded surface of a device wafer for cleaning purposes, wafer flipping to expose a secondary surface for further processing, providing support for alignment and bonding to another primary temporary carrier or device wafer, or for releasing the thinned wafer to a tape frame carrier for dicing purposes. The wafer carrier of this invention is capable of supporting thinned wafers including those having a thickness less than 100 micrometers. The wafer carrier includes means for attachment and means for detachment that are both quick and compatible with other semiconductor processing tools. The wafer carrier of this invention is made of chemically inert materials, and is capable of maintaining a sustained attachment during wet processing, spin cleaning, and exposure to high temperatures in excess of 250° C. The wafer carrier has a structural design that does not interfere with, smear, shear off, or contaminate wafer surface structures such as micro bumping, metal post or studs or bond pads. The wafer carrier provides portability to thinned wafers and allows them to move through process steps in various production modules or be transported in device carriers or front opening unified pods (FOUPS).

BRIEF DESCRIPTION OF THE DRAWINGS

Referring to the figures, wherein like numerals represent like parts throughout the several views.

DETAILED DESCRIPTION OF THE INVENTION

Figure 1:
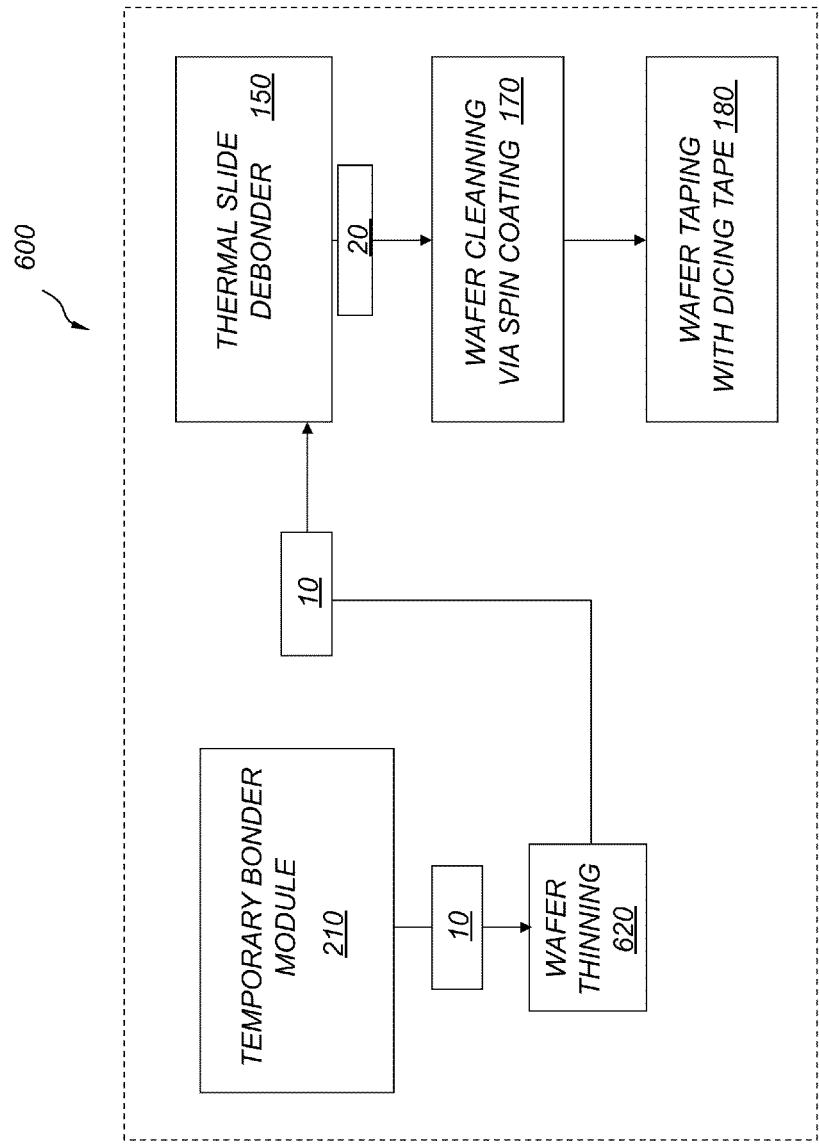
FIG. 1 is an overview schematic diagram of a temporary wafer bonder and debonder system.

Referring to FIG. 1, an apparatus for temporary wafer bonding 600 includes a temporary bonder 210, a wafer thinning module 620, a thermal slide debonder 150, a wafer cleaning station 170, and a wafer taping station 180. Bonder 210 facilitates the temporary bonding processes 60a, shown in FIG. 1A and debonder 150 facilitates the thermal slide debonding processes 60b, shown in FIG. 1A.

Figure 1A:
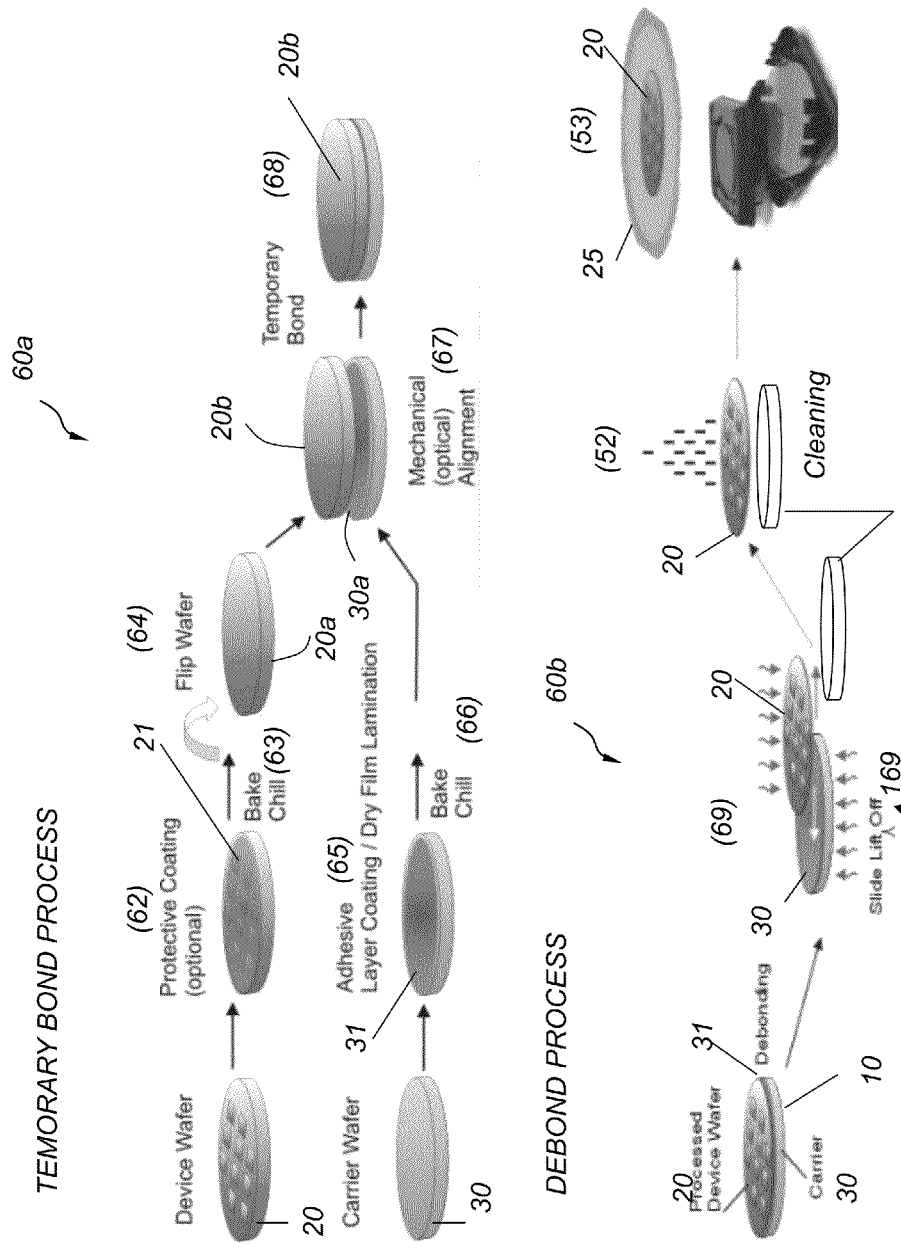
FIG. 1A is a schematic diagram of temporary wafer bonding process A and debonding process A performed in bonder 210 and debonder 150 of FIG. 1, respectively.

Referring to FIG. 1A, temporary bond process 60a includes the following steps. First, device wafer 20 is coated with a protective coating 21 (62), the coating is then baked and chilled (63), and then the wafer is flipped (64). A carrier wafer 30 is coated with an adhesive layer 31 (65) and then the coating is baked and chilled (66). In other embodiments, a dry adhesive film is laminated onto the carrier wafer, instead of coating an adhesive layer. Next, the flipped device wafer 20 is aligned with the carrier wafer 30 so that the surface of the device wafer with the protective coating 20a is opposite to the surface of the carrier wafer with the adhesive layer 30a (67), and then the two wafers are bonded (68) in the temporary bonder module 210. The bond is a temporary bond between the protective layer 21 and the adhesive layer 31. In other embodiments, no protective coating is applied onto the device wafer surface and the device wafer surface 20a is directly bonded with the adhesive layer 31. Examples of device wafers include GaAs wafers, silicon wafers, or any other semiconductor wafer that needs to be thinned down to less than 100 micrometers. These thin wafers are used in CMOS image sensors, stack memory applications, military and telecommunication applications for the fabrication of power amplifiers, or other power devices where good heat removal and small power factor are desirable. The carrier wafer 30 is usually made of a non-contaminating material that is thermally matched with the device wafer, i.e., has the same coefficient of thermal expansion (CTE). Examples of carrier wafer materials include silicon, glass, sapphire, quartz or other semiconductor materials. The diameter of the carrier wafer 30 is usually the same as or slightly larger than the diameter of the device wafer 20, in order to support the device wafer edge and prevent cracking or chipping of the device wafer edge. In one example, the carrier wafer thickness is about 1000 micrometers and the total thickness variation (TTV) is 2-3 micrometers. Carrier wafers are recycled and reused after they are debonded from the device wafer. In one example, adhesive layer 31 is an organic adhesive Wafer-BOND™ HT-10.10, manufactured by Brewer Science, Missouri, USA. Adhesive 31 is applied via a spin-on process and has a thickness in the range of 9 to 25 micrometers. The spin speed is in the rage of 1000 to 2500 rpm and the spin time is between 3-60 seconds. After the spin-on application, the adhesive layer is baked for 2 min at a temperature between 100° C. to 150° C. and then cured for 1-3 minutes at a temperature between 160° C. to 220° C. WaferBOND™ HT-10.10 layer is optically transparent and is stable up to 220° C. The bonded wafer stack 10 is placed in a thinning module 120. After the thinning 120 of the exposed device wafer surface 20b the carrier wafer 30 is debonded via the debond process 60b, shown in FIG. 1A. Debond process 60b, includes the following steps. First, heating the wafer stack 10 until the adhesive layer 31 softens and the carrier wafer 30 slides off from the thinned wafer (69). The WaferBOND™ HT-10.10 debonding time is less than 5 minutes. The thinned wafer 20 is then placed upon a secondary transportable carrier 100. Secondary transportable carrier 100 with the thinned wafer 20 is then moved to a cleaning station 170 where any adhesive residue is stripped away (52) and then to a taping station 180 where the thinned wafer 20 is placed in a dicing frame 25 (53). Finally, the taped thinned device wafer 20 is moved to a cassette and the carrier wafer 30 is moved to a different cassette.

In cases where the thinned device wafer is thicker than about 100 micrometers usually no additional support is needed for moving the thinned wafer 20 from the thermal slide debonder 150 to the further processing stations 170, 180. However, in cases where the thinned device wafer 20 is thinner than 100 micrometers, a secondary support mechanism is required to prevent breaking or cracking of the thinned device wafer. Currently, the secondary support mechanism includes an electrostatic carrier or a carrier comprising a Gelpak™ acrylic film on a specially constructed wafer. As was mentioned above, these secondary support mechanism add complications and cost to the process.

The present invention utilizes a transportable secondary carrier 100 for transferring the thinned wafer 20 during the follow up process steps of cleaning (52) and mounting onto a dicing tape (53).

Figure 2:
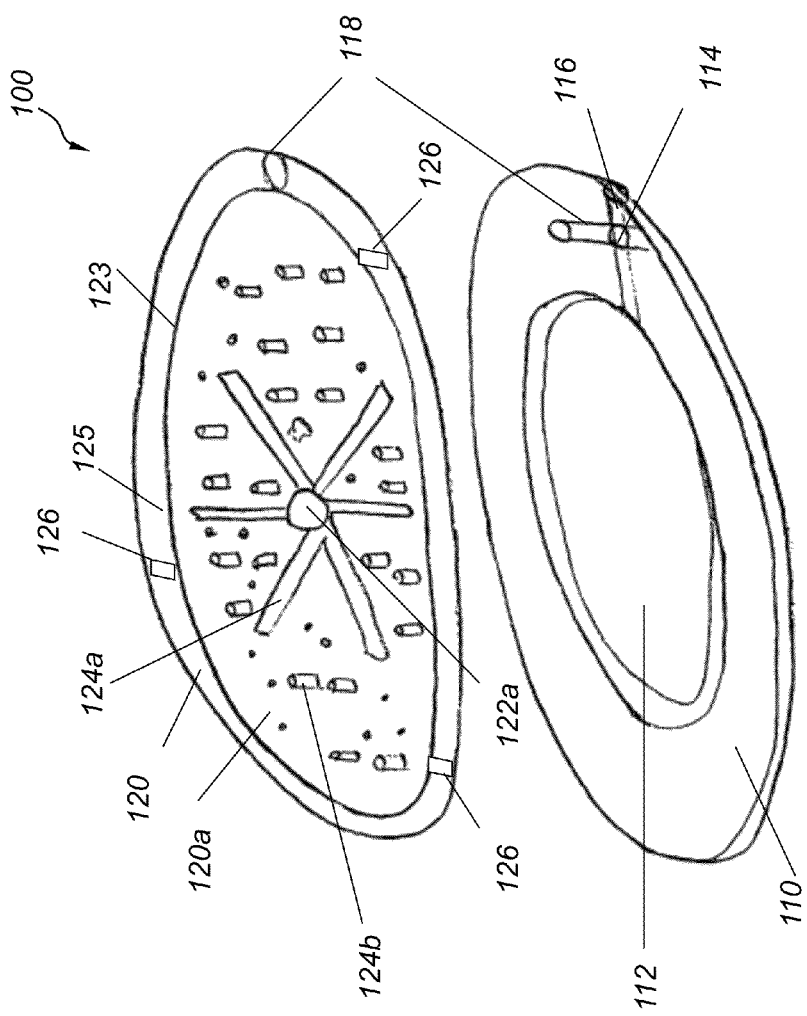
FIG. 2 is an exploded view of the secondary carrier 100 in FIG. 1A.
Figure 3:
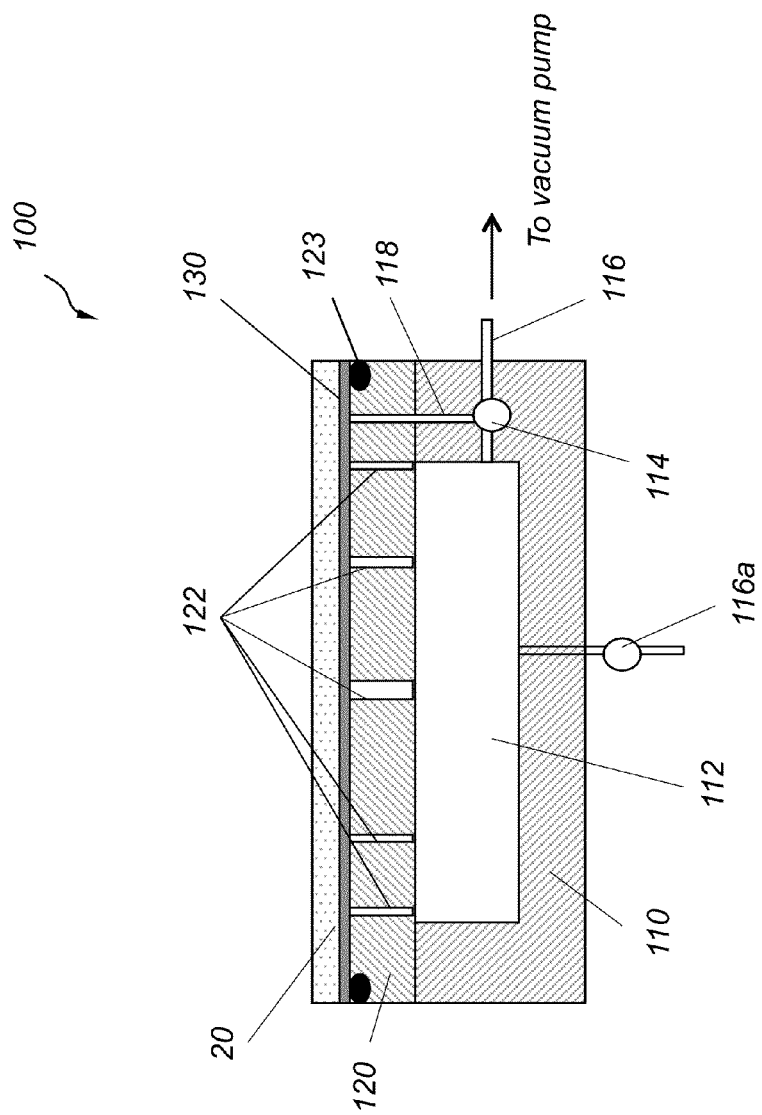
FIG. 3 is a cross-sectional side view of the secondary carrier of FIG. 2.

Referring to FIG. 2 and FIG. 3, the transportable secondary carrier 100 includes a top component 120 and a bottom component 110. Top and bottom components 120, 110 are stacked and attached to each other, as shown in FIG. 3. The thinned wafer 20 is carried on the top surface 120a of the top component 120. The top surface 120a of the top component 120 is dimensioned to match the size of the supported thinned wafer 20. In one example, top and bottom components 120, 110 are dimensioned to accommodate thinned wafers 20 having diameters in the range between 50 mm to 300 mm. Top and bottom components 120, 110 are made of silicon, alumina, or other ceramic materials that are structurally rigid, chemically inert, can withstand process temperatures in excess of 200° C., solvents, inorganic acids, and bases and have a coefficient of thermal expansion (CTE) that matches the thinned wafer's CTE. In other embodiments, top and bottom components 120, 110 are detachable, allowing the carrier 100 to have interchangeable top components 120 in order to support wafers with variable topographies and dimensions on the same bottom wafer 110.

Figure 4:
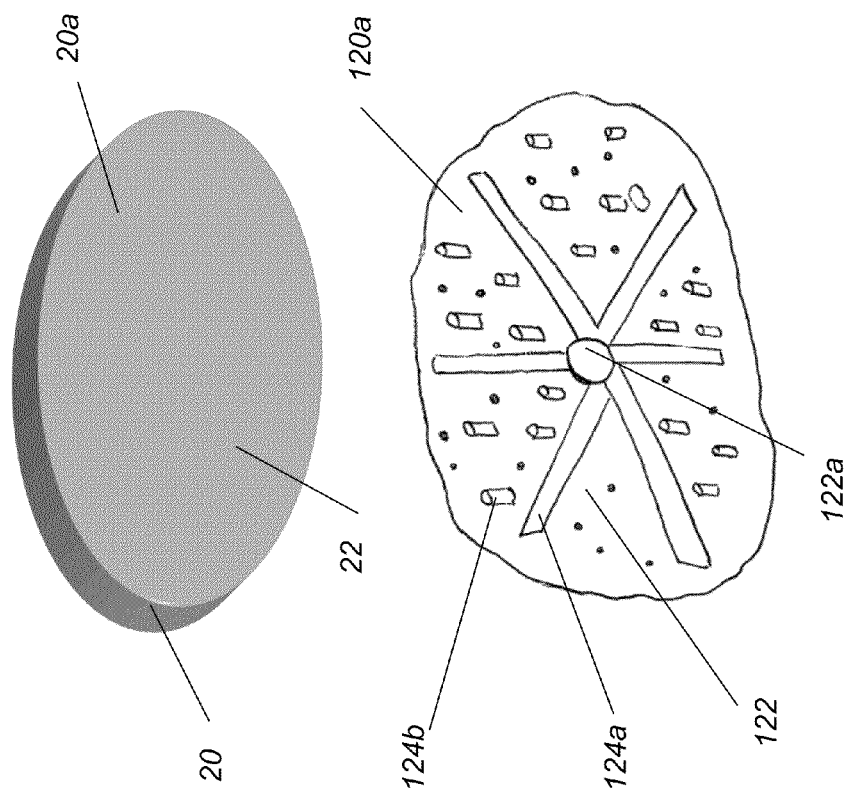
FIG. 4 depicts an area of the top surface of the secondary carrier of FIG. 2 and the bumped surface 20a of the thinned wafer 20.
Figure 5:
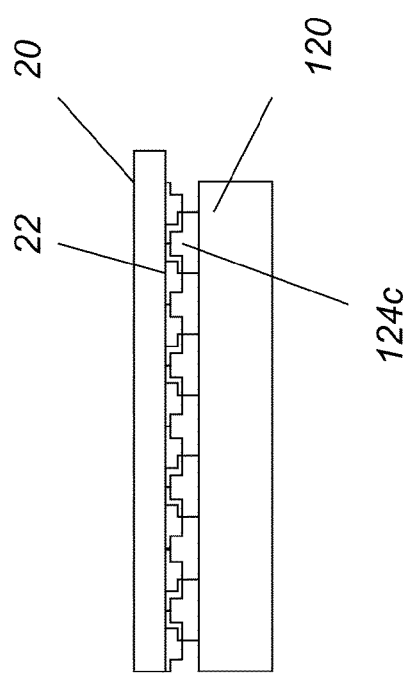
FIG. 5 depicts a detailed cross-sectional area of the interface between the top component and the thinned wafer 20.

Top surface 120a of the top component 120 includes three-dimensional support structures 124 used to support the bumped surface 20a of the thinned wafer 20, shown in FIG. 4. The three-dimensional support structures prevent flexure of the thinned wafer and are aligned to points on the thinned wafer, such as dicing alleys, to avoid damaging TSV pads, posts, or micro bumps. Examples of structures 124 include radially extending arms 124a, posts 124b, shown in FIG. 4, and complex structures 124c complementing the bumps, bond pads or other structures 22 of the thinned wafer 20, shown in FIG. 5. In all these examples, support structures 124 are placed on locations of the bumped wafer surface 20a so that they don't interfere with the existing bumps, or bond pads 22, or other structures on the wafer surface 20a. Support structures 124 have dimensions matching the dimensions of the bumps, bond pads and the other structures 22 on the bumped wafer surface 20a. In one example, support structures 124 have a height in the range of 20-50 micrometers and a width of about 50-100 micrometers. Support structures 124 are produced via chemical deposition techniques using photolithography or a photo-mask. Support structures 124 may also be machined via chemical or abrasive type etching. The chemical deposition techniques include chemical vapor deposition (CVD), physical vapor deposition (PVD), and metal-organic chemical vapor deposition (MOCVD). A support mask or photolithography pattern is used to provide wafer support on the carrier surface. Masks are used to outline the fabrication of the three-dimensional support structures around primary structures of the wafers surface topography for removal of material and photolithography patterns are used for the deposition of material. These three-dimensional support structures do not make primary contact with individual die and prevent damage of delicate structures such as micro-bumps. For example by creating a three-dimensional support structure with primary support along dicing alleys and providing a tolerance for clearance, each micro bump array can be accommodated for support without being damaged. The dimensions of the mask which creates three-dimensional support structures micro-machined into the alumina or ceramic carrier surface are directly provided by the layout features of the wafer surface and provide the needed support during the vacuum process.

In some embodiments, support structures 124 are also coated with a protective coating layer or covered with a compliant membrane 130, as shown in FIG. 3. In one example, coating layer 130 may be polyimide, PEEK, or any other inert high temperature thermoset or thermoplastic layer, suitable for protecting the wafer surface bumps, bond pads and structures 22. In another embodiment, an elastomeric heat tolerant compliant membrane 130 covers the entire surface 120a of the top component 120, stretches across the three-dimensional structures 124, and fills in the gaps between the support structures 124, thereby preventing damage of the thin wafer surface topography (i.e., bumps, bond pads and other structures) due to abrasion. Membrane 130 includes a plurality of pinholes thus forming a flexible chuck vacuum membrane. In one example, compliant membrane 130 is made of Kalrez, manufactured by DuPont. Top surface 120a also includes vacuum ports 122 and a vacuum seal 123. Vacuum ports 122 extend through the thickness of the top component 120 and connect to a vacuum reservoir 112 formed in the bottom component 110, as will be described below. Vacuum ports 122 include openings dispersed throughout the top surface 120a and/or a central port 122a. In one example, vacuum seal 123 is an O-ring placed in a radial groove 125 formed on the periphery of the top surface 120a. Seal 123 may be made of Viton, silicone rubber or ethylene propylene diene monomer (EPDM) rubber, among others. The height of the seal ring 123 in its compressed state closely matches the elevation of the three-dimensional support structures 124 that are photo-machined into the surface 120a to prevent flexing of the thinned wafer 20 and premature release at the seal ring 123.

The top surface 120a of the top component 120 also includes alignment structures 126 used for orienting and aligning the thinned wafer 20. Alignment structures 126 may be pins, groves, notches, or elastomeric inserts embedded in the top surface 120a. Alignment structures 126 are used for aligning the wafer flat or in line with a wafer notch for secondary alignment to other carriers or other wafers. Alignment structures 126 are also used for fiducial recognition by automatic bond aligners.

The bottom component 110 includes a vacuum reservoir 112 that connects to a vacuum pump (not shown) via a closable port 116. Vacuum reservoir 112 is evacuated and then closed off in order to provide a standing vacuum force sufficient to hold the thinned wafer 20 for extended time periods. The vacuum reservoir 112 is evacuated by a vacuum source (pump) via the external closable port 116. The vacuum source is removed after vacuum is pulled in the device 100 thus making the wafer carrier device transportable without any attachments. Upon transfer of the wafer carrier device 100 to a second process tool, the vacuum in reservoir 112 can be refreshed, thereby maintaining the vacuum capability for extended period of time and over multiple process steps. In some embodiments, a second port 116a is used to engage a port on the chucks of the process station. In one example this second port 116a is a poppet type and is mechanically opened when the carrier 100 is on the process chuck. The vacuum system adjusts the vacuum during thermal cycles to compensate for CTE mismatches between the carrier 100 and the device wafer 20, thereby overcoming potential shearing forces. Adjustable vacuum also benefits very thin wafers with substantial gaps between bumps. In this case, reduced vacuum decreases any bending moments applied to the wafer between the bumps.

Vacuum port 116 incorporates a micro valve assembly 114 that includes a primary and a secondary micro valve. The primary micro valve allows the reservoir vacuum 112 to be isolated before the external port 116 is opened and the secondary micro valve releases to the vacuum source to refresh the vacuum reservoir. This valve assembly 114 is actuated from the top or bottom of the carrier 100 by mechanical means and controls the evacuation of the reservoir 112. Vacuum reservoir 112 connects via ports 122 to the upper surface 120a of the top component 120, as shown in FIG. 3. The thinned wafer 20 is placed on top of the top component surface 120a with the bumped surface 20a facing the top surface 120a and is held in place via vacuum supplied by the vacuum reservoir 112 through ports 122. With applied vacuum and the two micro valves closed, the thinned wafer 20 is adhered to the top surface 120a of the top component 120. When both micro valves are opened, vacuum reservoir 112 is filled with air and the thinned wafer 20 is released.

Other embodiments include one or more of the following. The top component 120 is made of a flexible elastomeric membrane with a plurality of pinholes. This type of a carrier has a flexible top surface and is used for supporting blanket wafers or wafers that have no surface topography. Sealing component 123 may be spin-coated on the periphery of the top surface 120a. In one example, the spin-coated sealing component 123 is polyimide and forms a pronounced edge-bead which creates the seal. The carrier of this invention may be used for handling of thinned wafers in any other application. In one example, the carrier 100 is used for flipping the device wafer before affixing it to the dicing tape.

Several embodiments of the present invention have been described. Nevertheless, it will be understood that various modifications may be made without departing from the spirit and scope of the invention. Accordingly, other embodiments are within the scope of the following claims.

What is claimed is:
1. A transportable wafer carrier device comprising:
a wafer chuck comprising a top component and a bottom component and wherein said top component comprises a top surface and bottom surface and wherein said bottom component comprises an enclosed vacuum reservoir and is in contact with the bottom surface of the top component, and wherein the top surface of the component is configured to support a wafer so that a wafer surface comprising three-dimensional structures is in contact with the top surface of the top component;
wherein said top component comprises one or more through-openings extending from the top surface to the bottom surface of the top component and communicating with the vacuum reservoir and wherein the wafer is held onto the top surface of the top component via vacuum from said vacuum reservoir drawn through said through-openings;
wherein the top surface of the top component comprises three-dimensional support structures extending outward from the top surface of the top component and being shaped and dimensioned to support the wafer, and are aligned to points on the wafer surface configured to not interfere with bumps or bonds formed on the wafer surface.
2. The device of claim 1 further comprising a sealing component placed on a perimeter of the top surface of the top component and configured to form a seal between the top surface of the top component and the wafer surface being in contact with the top surface.

3. The device of claim 2 wherein the sealing component is formed on the perimeter of the top surface of the top component via spin-coating.

4. The device of claim 1, wherein the top surface of the top component is dimensioned to match the wafer dimensions.

5. The device of claim 1, wherein the top component is detachably attached to the bottom component, thereby allowing the wafer carrier to have interchangeable top components.

6. The device of claim 1, wherein the top and bottom components comprise one of silicon, alumina, or ceramic materials with a coefficient of thermal expansion that matches the coefficient of thermal expansion of the wafer.

7. The device of claim 1, wherein the three-dimensional support structures of the top component comprise posts or radially extending arms. in contact with the top surface.

8. The device of claim 1, wherein the three-dimensional support structures of the top component comprise structures complementing the bumps or bond pads formed on the wafer surface being in contact with the top surface of the top component.

9. The device of claim 1, wherein the three-dimensional support structures of the top component are produced via chemical deposition techniques comprising one of chemical vapor deposition, physical vapor deposition, or metal-organic chemical vapor deposition.

10. The device of claim 1, wherein the three-dimensional support structures of the top component are produced by depositing a photochemically sensitive layer and applying photolithography and photomasking techniques.

11. The device of claim 1, wherein the three-dimensional support structures of the top component are machined via chemical or abrasive etching.

12. The device of claim 1, wherein the three-dimensional support structures of the top component are coated with a protective layer, and wherein said protective layer comprises one of polyimide, PEEK or a thermoplastic layer.

13. The device of claim 1 further comprising a compliant heat tolerant membrane member attached to the top surface of the top component.

14. The device of claim 13 wherein the compliant membrane comprises one of Kalrez, Teflon, or a fluoropolymer.

15. The device of claim 1, further comprising a sealing component placed in a radial groove formed on a perimeter of the top surface of the top component and wherein the sealing component comprises an O-ring having a height matching the height of the three dimensional support structures of the top component.

16. The device of claim 1 wherein the top surface of the top component further comprises alignment structures for orienting and aligning the wafer.

17. The device of claim 16 wherein the alignment structures comprise one of pins, grooves, notches, or elastomeric inserts embedded in the top surface of the top component.

18. The device of claim 1, wherein the bottom component further comprises a vacuum port connecting the vacuum reservoir to a vacuum pump.

19. The device of claim 18 further comprising a micro-valve assembly and wherein the micro-valve assembly isolates the vacuum reservoir from the vacuum port.

20. The device of claim 1 wherein the wafer is held on the top surface of the top component via an adjustable vacuum.

21. The device of claim 1 wherein the three-dimensional support structures of the top component comprise structures complementing three dimensional structures formed on the wafer surface being in contact with the top surface of the top component.

* * * * *